(12) United States Patent
Ohtani et al.

(10) Patent No.: US 7,521,754 B2
(45) Date of Patent: Apr. 21, 2009

(54) SEMICONDUCTOR CELL ARRAY WITH UNIT CELLS HAVING ADJACENTLY SURROUNDING SOURCE AND GATE ELECTRODE

(75) Inventors: Kinya Ohtani, Kanagawa (JP); Kenya Kobayashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/372,143

(22) Filed: Mar. 10, 2006

(65) Prior Publication Data

US 2006/0214240 A1 Sep. 28, 2006

(30) Foreign Application Priority Data

Mar. 25, 2005 (JP) .............................. 2005-090144

(51) Int. Cl.
*H01L 27/088* (2006.01)
(52) U.S. Cl. ................. 257/330; 257/401; 257/E29.022
(58) Field of Classification Search ................. 257/242, 257/262, 263, 302, 330, 401
See application file for complete search history.

(56) References Cited

U.S. PATENT DOCUMENTS

| | | | | |
|---|---|---|---|---|
| 4,994,871 A * | 2/1991 | Chang et al. | ................. | 257/139 |
| 5,093,701 A * | 3/1992 | Nakagawa et al. | .......... | 257/341 |
| 5,468,982 A * | 11/1995 | Hshieh et al. | ................ | 257/331 |
| 6,005,271 A * | 12/1999 | Hshieh | ........................ | 257/341 |
| 6,225,649 B1 * | 5/2001 | Minato | ........................ | 257/133 |
| 6,445,036 B1 * | 9/2002 | Maruoka | ..................... | 257/330 |
| 6,603,173 B1 * | 8/2003 | Okabe et al. | ................ | 257/330 |
| 6,750,507 B2 * | 6/2004 | Williams et al. | ............ | 257/328 |
| 7,064,384 B2 * | 6/2006 | Hara et al. | ................... | 257/330 |
| 7,126,187 B2 * | 10/2006 | Aoki et al. | ................... | 257/330 |
| 2002/0043684 A1 * | 4/2002 | Kubo | ........................ | 257/327 |
| 2002/0060339 A1 * | 5/2002 | Maruoka | ..................... | 257/330 |
| 2003/0090003 A1 * | 5/2003 | Nishiura | ..................... | 257/784 |
| 2006/0102953 A1 * | 5/2006 | Miura et al. | ................ | 257/330 |

FOREIGN PATENT DOCUMENTS

| JP | 2001-102576 A | 4/2001 |
|---|---|---|
| JP | 2001-352063 A | 12/2001 |

* cited by examiner

*Primary Examiner*—Sue A Purvis
*Assistant Examiner*—W. Wendy Kuo
(74) *Attorney, Agent, or Firm*—Foley & Lardner LLP

(57) ABSTRACT

A semiconductor device 1 is a vertical MOSFET, and includes a plurality of unit cells 10 and a gate electrode 20. Each unit cell 10 includes a back-gate region 12 formed in the semiconductor substrate and a source region 14 formed in the semiconductor substrate so as to adjacently surround the back-gate region 12 in a plan-view. A portion of the back-gate region 12 is adjacent to the gate electrode 20. More specifically, the back-gate region 12 is in a rectangular plan-view shape, and adjacent to the gate electrode 20 at a pair of opposing sides out of the four sides thereof.

21 Claims, 16 Drawing Sheets

SEMICONDUCTOR CELL ARRAY WITH UNIT CELLS HAVING ADJACENTLY SURROUNDING SOURCE AND GATE ELECTRODE

This application is based on Japanese patent application No. 2005-090144, the content of which is incorporated hereinto by reference.

BACKGROUND

1. Technical Field

The present invention relates to a semiconductor device.

2. Related Art

Semiconductor devices so far developed include those disclosed in Japanese Laid-open patent publications No. 2001-102576 and No. 2001-352063. The semiconductor device according to these publications is a vertical MOSFET, which includes a plurality of unit cells, respectively consisting of a back-gate region (body contact region) provided in a semiconductor substrate and a source region disposed so as to surround the back-gate region. Each of the unit cells is surrounded by a gate electrode buried in a trench formed in the semiconductor substrate.

SUMMARY OF THE INVENTION

In a semiconductor device including a trench gate structure as those described in the above-mentioned publications, normally an intense electric field region is constituted just under the trench gate, so that a breakdown current runs from the back-gate region to the region just under the trench gate. At this moment, however, in the semiconductor device according to the documents, the breakdown current runs under the source region surrounding the back-gate region. This provokes a parasitic bipolar transistor action, thereby resulting in degradation in avalanche resistance of the semiconductor device.

According to the present invention, there is provided a semiconductor device comprising a unit cell including a back-gate region provided in a semiconductor substrate and a source region provided adjacently around the back-gate region in a plan view, and a gate electrode provided in a trench provided in the semiconductor substrate so as to surround the unit cell, wherein the unit cell coincides in a plan view with a residual region that remains upon deducting from a surrounding region defined as the imaginary rectangular region being the smallest among those capable of containing the unit cell, a removed region constituting a part of the surrounding region, and a portion of the back-gate region is adjacent to the gate electrode in the removed region.

In the semiconductor device thus constructed, a portion of the back-gate region is adjacent to the gate electrode. This leads a breakdown current to run from the back-gate region to a region just under the trench gate, through the boundary between the adjacent back-gate region and the gate electrode. Accordingly, the foregoing structure suppresses a parasitic bipolar transistor action provoked by the breakdown current passing just under the source region. Also, the unit cell coincides with the residual region obtained upon deducting the removed region from the surrounding region. Accordingly, the cell area can be decreased by a portion corresponding to the removed region, when compared with a unit cell provided over the entire surrounding region. Provided that the channel width is unchanged, the smaller the cell area is, the larger the channel width per unit area becomes. Therefore, the present invention provides a semiconductor device appropriate for improving the channel width per unit area.

The present invention thus provides a semiconductor device that effectively suppresses a parasitic bipolar transistor action provoked by a breakdown current, and facilitates improving the channel width per unit area.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
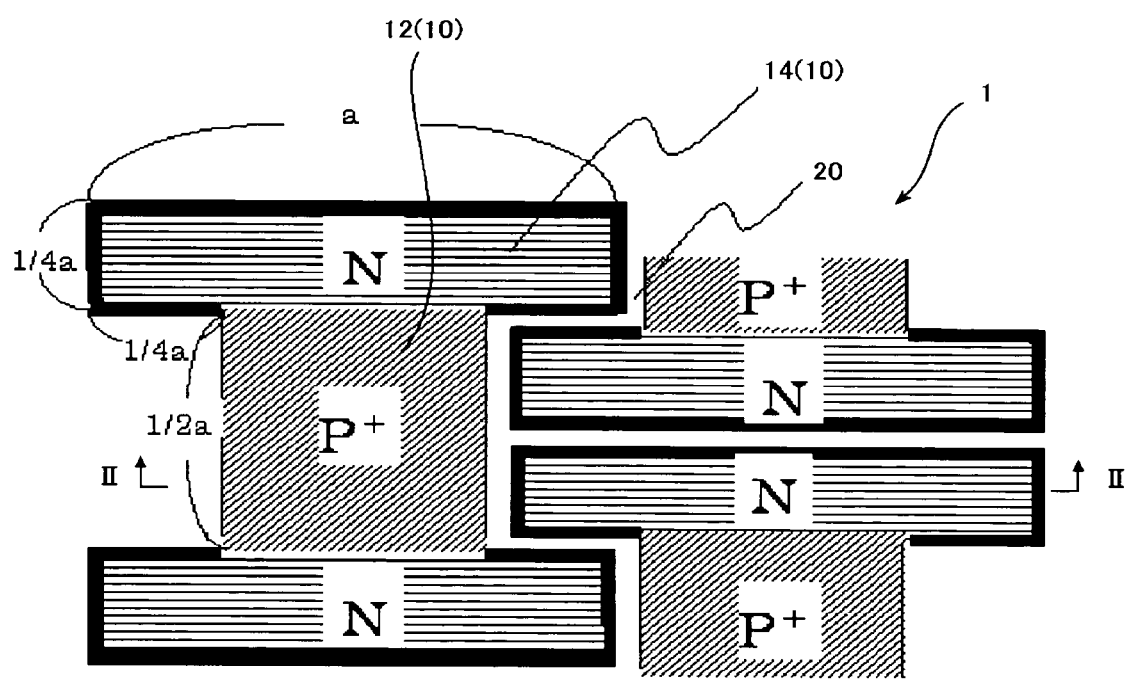
FIG. 1 is a schematic plan view showing a semiconductor device according to the first embodiment of the present invention.

The present invention will now be described herein with reference to illustrative embodiments. Those skilled in the art will recognize that many alternative embodiments can be accomplished using the teachings of the present invention and that the invention is not limited to the embodiments illustrated for explanatory purposes.

Referring to the accompanying drawings, exemplary embodiments of a semiconductor device according to the present invention will be described in detail hereunder. In the drawings, same constituents are given identical numerals, and duplicating description thereof will be omitted.

First Embodiment

Figure 2:
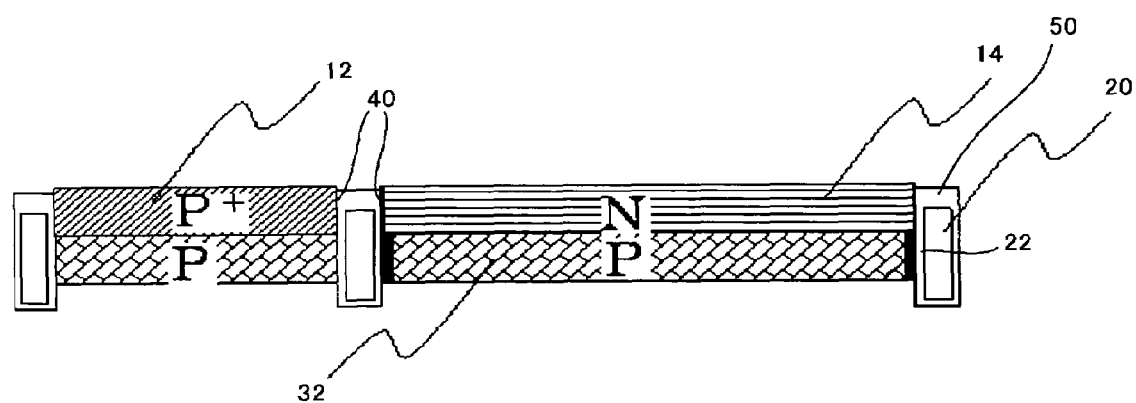
FIG. 2 is a cross-sectional view taken along the line II-II of FIG. 1.

FIG. 1 is a schematic plan view showing a semiconductor device according to the first embodiment of the present invention. FIG. 2 is a cross-sectional view taken along the line II-II of FIG. 1. The semiconductor device 1 is a vertical MOSFET, and includes a plurality of unit cells 10, and a gate electrode 20. Each unit cell 10 includes a back-gate region 12 formed in a semiconductor substrate, and a source region 14 formed in the semiconductor substrate so as to adjacently surround the back-gate region 12 in a plan view. Here, the semiconductor substrate may be a silicon substrate, for example. Also, in this embodiment it is to be assumed that the respective unit cells 10 are of the same shape as one another.

The back-gate region 12 and the source region 14 are provided on a base region 32 as shown in FIG. 2. The base region 32 is formed on a drain region, which is not shown. In this embodiment, the conduction types of the back-gate region 12, the source region 14, the base region 32 and the drain region are $P^+$, N, P and N respectively.

Along the boundary between the unit cells 10, a gate electrode 20 is provided. The gate electrode 20 is located in a trench 40 formed in the semiconductor substrate, so as to surround the unit cell 10. The source region 14, the gate electrode 20 and the drain region constitute a MOSFET, and the base region 32 includes a channel. Here, the channel width in the respective unit cells 10 may be defined as the length of a projection of a portion of the perimeter of the source region 14 adjacent to the gate electrode 20, projected on a plane parallel to a surface of the semiconductor substrate. Accordingly, since the plane shown in FIG. 1 is parallel to the surface of the substrate, the length of bold lines in FIG. 1 corresponds to the channel width of the unit cells 10.

The back-gate region 12 is provided so that a portion thereof is adjacent to the gate electrode 20. To be more detailed, the back-gate region 12 is in a rectangular plan-view shape, and a pair of opposing sides, out of the four sides thereof is adjacent to the gate electrode 20. In this embodiment in particular, the back-gate region 12 is in a square shape. Although a gate oxide film 22 (Ref. FIG. 2) is interposed between the back-gate region 12 and the gate electrode 20, such structure will be herein construed as included in the concept that "the back-gate region 12 and the gate electrode 20 are adjacent to each other". Meanwhile, a portion of the perimeter of the back-gate region 12 not adjacent to the gate electrode 20, i.e. the other pair of opposing sides of the square, is adjacent to the source region 14.

Figure 3:
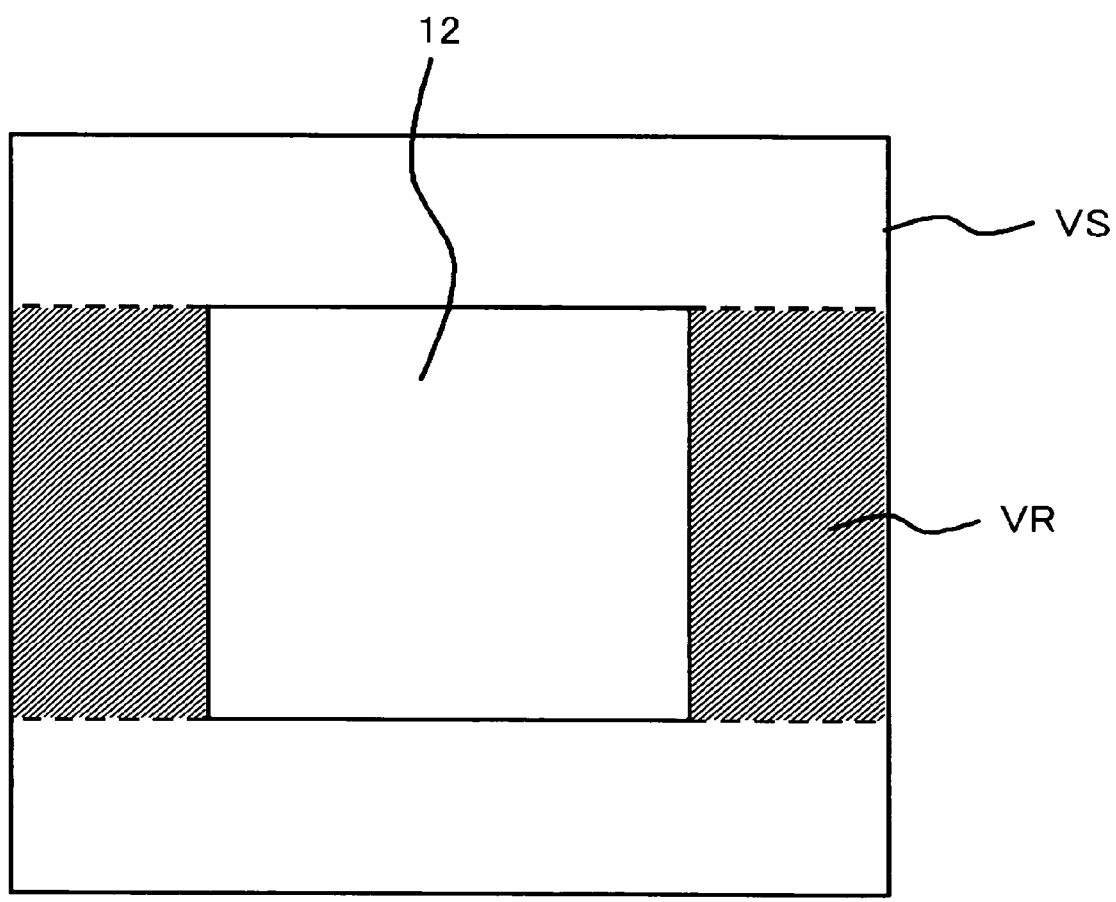
FIG. 3 is a schematic plan view for explaining a shape of a unit cell.

Referring to FIG. 3, the shape of the unit cell 10 will be described. In FIG. 3, a region VS (surrounding region) is an imaginary region that contains the back-gate region 12 and has a rectangular outline. A side of the surrounding region VS parallel to a first direction has a length equal to the maximum length of the unit cell 10 in the first direction. Likewise, a side of the surrounding region VS in a second direction orthogonal to the first direction has a length equal to the maximum length of the unit cell 10 in the second direction. Accordingly, the surrounding region VS is defined as a rectangular region that has the smallest area among any rectangular regions that can contain the unit cell 10. Here, the first and the second directions are assumed to be taken along a plane parallel to the substrate. In this embodiment, the first and the second directions are parallel to the sides of the back-gate region 12.

As is apparent upon comparison of FIG. 1 and FIG. 3, the unit cell 10 coincides in a plan view with a residual region obtained by deducting a region VR (removed region) from the surrounding region VS. The removed region VR constitutes a part of the surrounding region VS, as indicated by oblique lines in FIG. 3. In the removed region VR, the back-gate region 12 and the gate electrode 20 are adjacent to each other. Also as shown in FIG. 1, in the removed region VR of each unit cell 10, the source region 14 of an adjacent unit cell 10 is located. In other words, referring to two unit cells 10 adjacent to each other, a protruding portion of one of the unit cells 10 fits in a recessed portion of the other.

FIG. 1 also indicates that the source region 14 is disposed in two different regions in a single unit cell 10. Each region of the source region 14 is in a rectangular shape. The shape of each region of the source region 14 is a rectangle, the long side of which includes a portion where the back-gate region 12 and the source region 14 are adjacent to each other. In other words, the source region 14 is provided so as to be adjacent to each of a pair of opposing sides of the back-gate region 12. Further, the source region 14 is in a rectangular shape, a side of which includes the side of the back-gate region 12 and is longer than the side of the back-gate region 12. Accordingly, bent portions of planes where the channel is to be formed (the plane where the gate electrode 20 is formed) are all bent in 90 degrees. In the semiconductor device 1, the residual region is in a zygal shape, as shown in FIG. 1.

In this embodiment, when the length of the long side of the source region 14 is designated by a, the length of the short side of the source region 14 is a/4, and the length of a side of the back-gate region 12 is a/2. Under such configuration, the maximum length of the unit cell 10 in the first and the second directions both become equal to a, and hence the outline of the surrounding region VS is a square having the side length of a. Further, it is now apparent that the channel width of the unit cell 10, i.e. the portion of the perimeter of the source region 14 adjacent to the gate electrode 20 has a length equal to 4 a. It is preferable that this value is not less than the total perimetrical length of the surrounding region VS. Actually, since the perimetrical length of the surrounding region VS is 4 a in this embodiment, that condition is satisfied. Also, the crystal orientation of all boundary surfaces between the source region 14 and the gate electrode 20 is (100).

As shown in FIG. 2, an insulating interlayer 50 is provided on the gate electrode 20. The insulating interlayer 50 is located inside the trench 40. Namely, the surface of the insulating interlayer 50 is at a level the same as or lower than the surface of the back-gate region 12 and the source region 14. In this embodiment in particular, the latter case applies, and therefore the surface of the insulating interlayer 50 is recessed with respect to the surface of the back-gate region 12 and the source region 14.

The semiconductor device 1 thus configured offers the following advantageous effects. In the semiconductor device 1, a portion of the back-gate region 12 is adjacent to the gate electrode 20. Accordingly, a breakdown current can pass through the boundary therebetween, when running from the back-gate region 12 to a region just under the trench gate. Such configuration can suppress a parasitic bipolar transistor action provoked by the breakdown current running under the source region 14. This results in prevention of degradation in avalanche resistance of the semiconductor device 1.

The unit cell 10 coincides with the residual region obtained by deducting the removed region VR from the surrounding region VS. Accordingly, the cell area can be decreased by a portion corresponding to the removed region VR, when compared with a unit cell provided over the entire surrounding region VS. Provided that the channel width is unchanged, the smaller the cell area is, the higher the channel width per unit area becomes. Therefore, the semiconductor device 1 has an appropriate structure for improving the channel width per unit area. Improving thus the channel width per unit area facilitates reducing an on-resistance.

Figure 10:
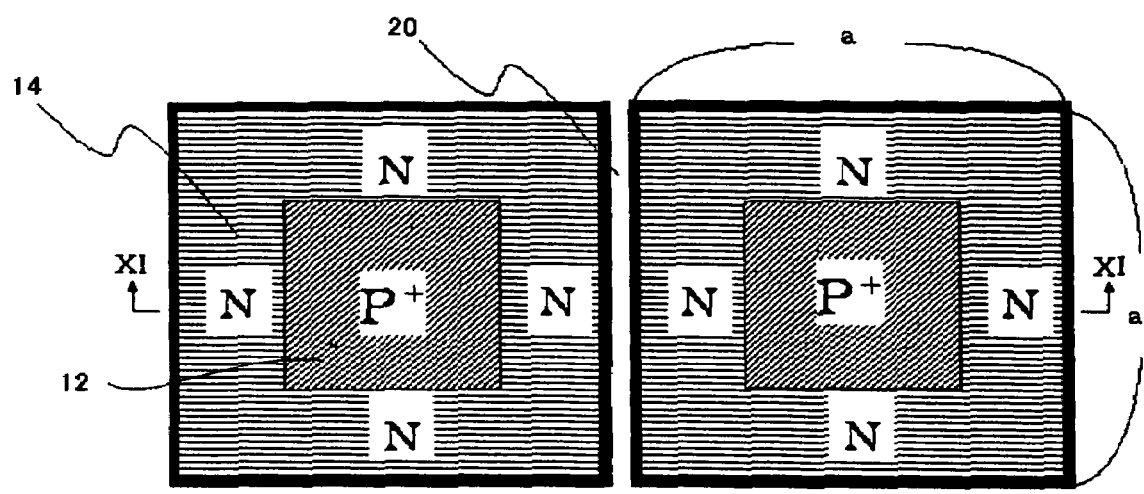
FIG. 10 is a schematic plan view showing a semiconductor device according to a comparative example with respect to the embodiment.
Figure 11:
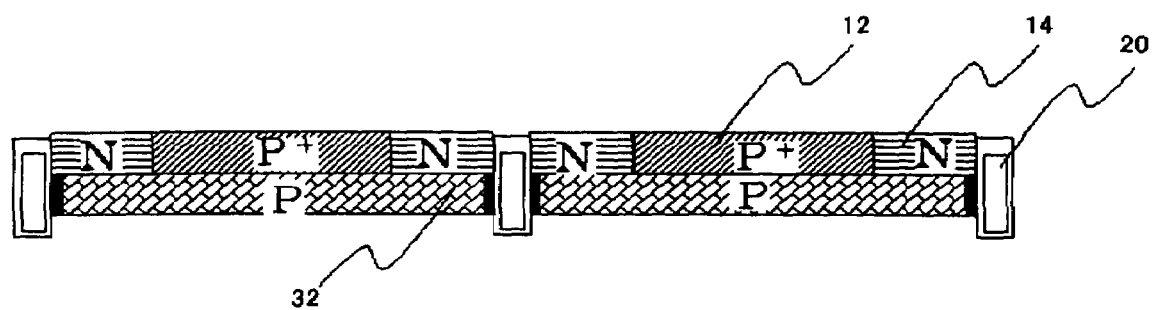
FIG. 11 is a cross-sectional view taken along the line XI-XI of FIG. 10.

FIG. 10 is a schematic plan view showing a semiconductor device according to a comparative example with respect to this embodiment. FIG. 11 is a cross-sectional view taken along the line XI-XI of FIG. 10. In FIG. 10, each unit cell is provided all over the surrounding region. In this case, the channel width and the cell area are 4 a and $a^2$, respectively. Accordingly, the channel width per unit area becomes 4/a. For increasing the channel width per unit area in this comparative example, the only feasible way is to reduce the unit cell size, i.e. the value of a. This remedy requires, however, further micronization of the minimum design scale, which leads to an increase in manufacturing cost.

On the contrary, in the semiconductor device 1, while the channel width is 4 a which is the same as in FIG. 10, the cell area is only 0.75 $a^2$. Accordingly, the channel width per unit area is approx. 5.33/a, which is approx. 1.33 times as large as that in the comparative example. Thus, the semiconductor device 1 achieves a larger channel width per unit area without further micronization of the minimum design scale.

When the channel width of the unit cell 10 is equal to or more than the total perimetrical length of the surrounding region VS, since the unit cell 10 is smaller in area than the surrounding region VS as repeatedly described, the channel width per unit area can naturally be increased.

The source region 14 is provided so as to be adjacent to each of a pair of opposing sides of the back-gate region 12, and has such a rectangular shape that a side of itself includes the side of the back-gate region 12 and is longer than the same side of the back-gate region 12. Such layout achieves a structure where a portion of the back-gate region 12 is adjacent to the gate electrode 20, without complicating the shape of the unit cell 10. In this embodiment in particular, both the back-gate region 12 and the source region 14 are in rectangular shapes, which simplifies the design work.

Since the crystal orientation at the boundary between the source region 14 and the gate electrode 20 is (100), the semiconductor device 1 offers high electron mobility. It is to be noted, however, that the crystal orientation at the foregoing boundary is not imperatively (100).

The insulating interlayer 50 is located inside the trench 40. This allows the entire surface of the back-gate region 12 and the source region 14 to serve as the contact region, thereby suppressing the contact resistance. It is to be noted, however, that the insulating interlayer 50 does not have to be located strictly inside the trench 40.

In the removed region VR of each unit cell 10, the source region 14 of another unit cell 10. Such layout allows increasing the cell integration level of the semiconductor device 1.

Second Embodiment

Figure 4:
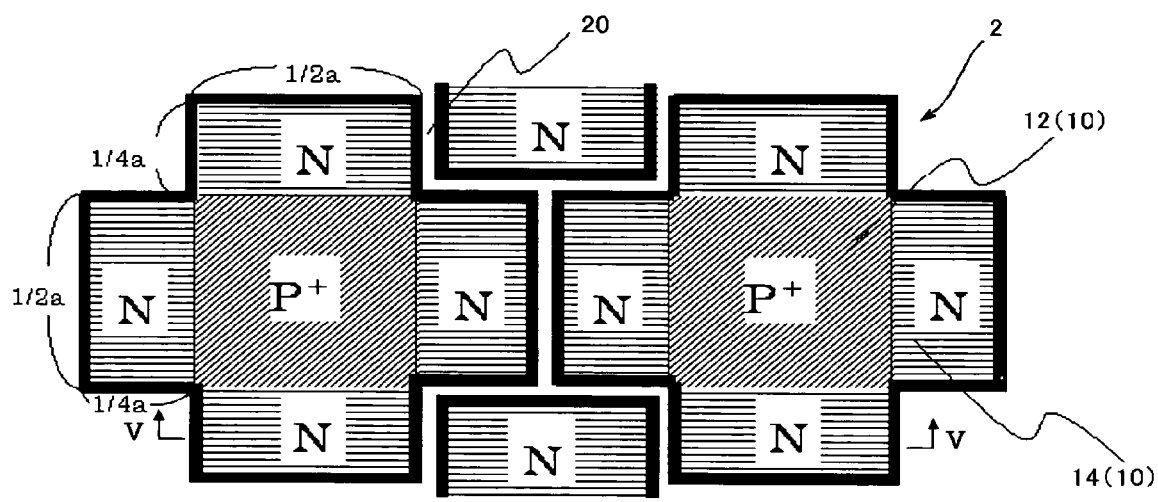
FIG. 4 is a schematic plan view showing a semiconductor device according to the second embodiment of the present invention.
Figure 5:
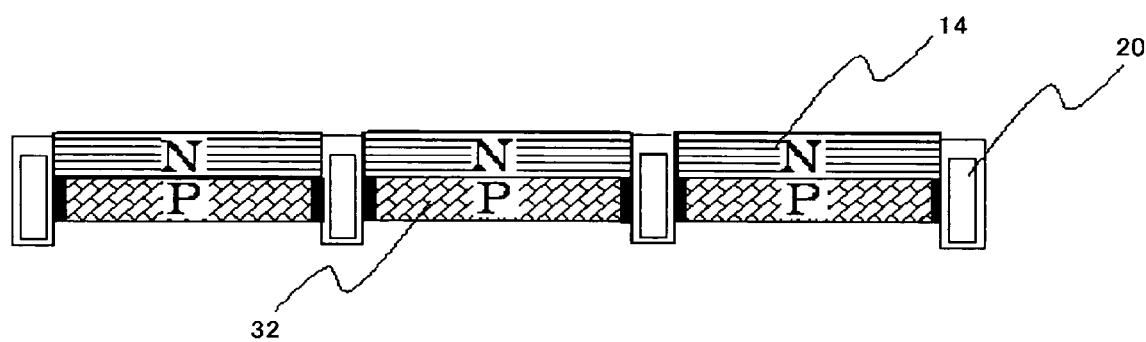
FIG. 5 is a cross-sectional view taken along the line V-V of FIG. 4.

FIG. 4 is a schematic plan view showing a semiconductor device according to the second embodiment of the present invention. FIG. 5 is a cross-sectional view taken along the line V-V of FIG. 4. The semiconductor device 2 is also a vertical MOSFET, and includes a plurality of unit cells 10 and a gate electrode 20.

In this embodiment also, a portion of the back-gate region 12 is adjacent to the gate electrode 20. To be more detailed, the back-gate region 12 is in a rectangular plan-view shape, and is adjacent to the gate electrode 20 at each of the four corners thereof. The source region 14 is provided so as to be adjacent to each of the four sides of the back-gate region 12. The source region 14 is in a rectangular shape having a side (the long side) corresponding to one of the sides of the back-gate region 12. The source region 14 is disposed in four separate portions in a single unit cell 10. In this embodiment, the length of the long and short sides of the source region 14 is a/2 and a/4, respectively. Each side of the back-gate region 12 has a length of a/2.

The unit cell 10 coincides in a plan view with a residual region obtained by deducting the removed region VR from the surrounding region VS. In this embodiment, the removed region VR corresponds to a square region located at each of the four corners of the surrounding region VS, and having the side length of a/4. In the removed region VR of each unit cell 10, the source region 14 of an adjacent unit cell 10 is located. In the semiconductor device 2, the residual region is in a cruciform shape, as shown in FIG. 4.

In the semiconductor device 2 equally, a portion of the back-gate region 12 is adjacent to the gate electrode 20. Accordingly, a breakdown current can pass through the boundary therebetween, when running from the back-gate region 12 to a region just under the trench gate. Such configuration can suppress a parasitic bipolar transistor action provoked by the breakdown current running under the source region 14. This results in prevention of degradation in avalanche resistance of the semiconductor device 2.

In addition, in the semiconductor device 2 also, the channel width and the cell area of the unit cell 10 are 4 a and 0.75 $a^2$ respectively, thus achieving the channel width per unit area of approx. 5.33/a. Therefore, semiconductor device 2 achieves larger channel width per unit area than the comparative example shown in FIGS. 10 and 11.

The source region 14 is provided so as to be adjacent to each of the four sides of the back-gate region 12, and is in a rectangular shape that has one of its sides corresponding to one of the sides of the back-gate region 12. Such layout achieves a structure where a portion of the back-gate region 12 is adjacent to the gate electrode 20, without complicating the shape of the unit cell 10. In this embodiment in particular, both the back-gate region 12 and the source region 14 are in rectangular shapes, which simplifies the design work.

Third Embodiment

Figure 12:
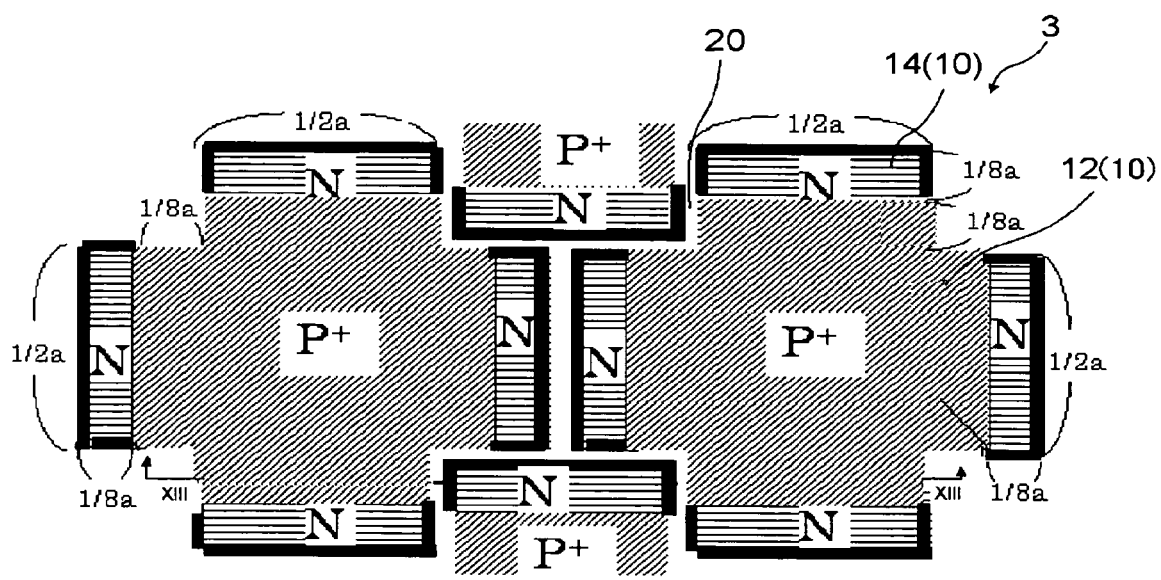
FIG. 12 is a schematic plan view showing a semiconductor device according to the third embodiment of the present invention.
Figure 13:
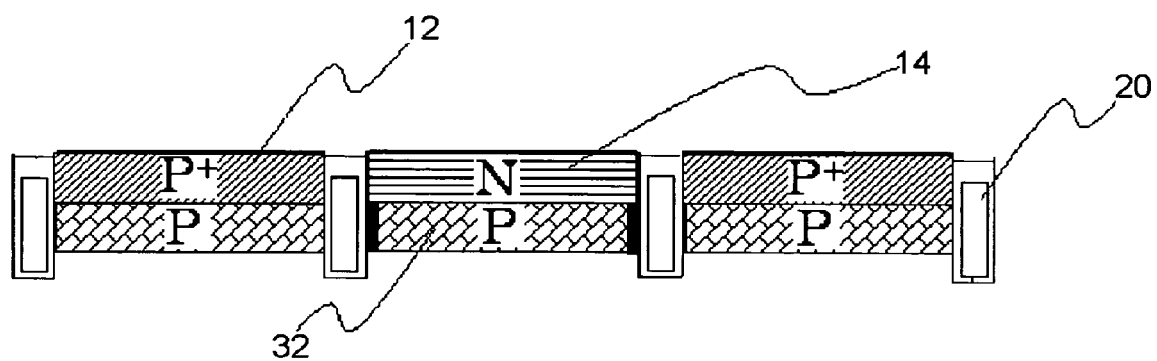
FIG. 13 is a cross-sectional view taken along the line XIII-XIII of FIG. 12.

FIG. 12 is a schematic plan view showing a semiconductor device according to the third embodiment of the present invention. FIG. 13 is a cross-sectional view taken along the line XIII-XIII of FIG. 12. The semiconductor device 3 is also a vertical MOSFET, and includes a plurality of unit cells 10 and a gate electrode 20.

Figure 14:
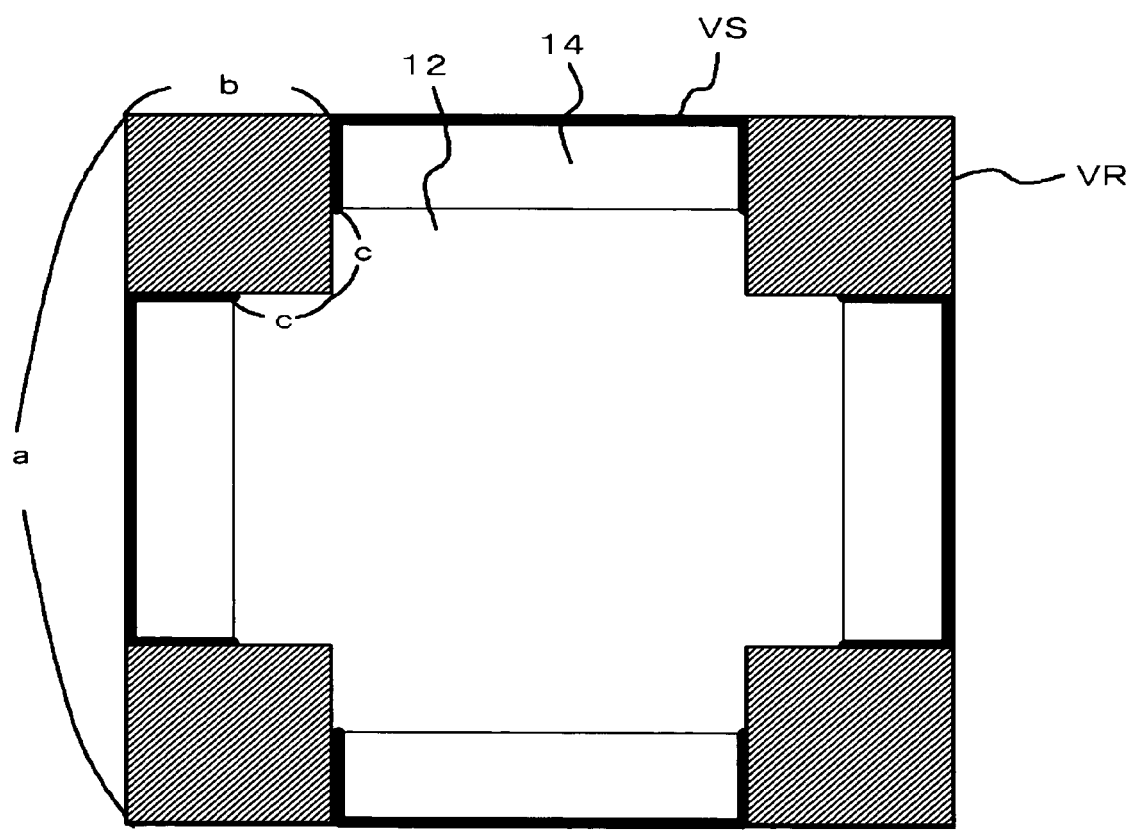
FIG. 14 is a schematic plan view for explaining the length of a portion at which a removed region and a back-gate region are adjacent to each other.

In this embodiment, the removed region VR is a square region located at each of the four corners of the surrounding region VS, as shown in FIG. 14. To be more detailed, the surrounding region VS and the removed region VR are both in square shapes, having the side length of a and b, respectively. The back-gate region 12 is adjacent to a portion of each of two sides of each removed region VR, and to the gate electrode 20 at the same portion. In other words, the back-gate region 12 is in a cross shape protruding toward the source region 14. In the semiconductor device 3, the residual region is in a cruciform shape, as shown in FIG. 12.

Here, it is preferable that a length c (Ref. FIG. 14) of the portion of each of the two sides of the removed region VR, to which the back-gate region 12 is adjacent, satisfies the condition of $0 < c \leq 2b^2/a$. Actually, the layout according to this embodiment satisfies this condition, since b=a/4 and c=a/8 as shown in FIG. 12.

Also in the semiconductor device 3, a portion of the back-gate region 12 is adjacent to the gate electrode 20. Accordingly, a breakdown current can pass through the boundary therebetween, when running from the back-gate region 12 to a region just under the trench gate. Such configuration can suppress a parasitic bipolar transistor action provoked by the breakdown current running under the source region 14. This results in prevention of degradation in avalanche resistance of the semiconductor device 3.

The back-gate region 12 is adjacent to a portion of each of the two sides of each removed region VR. Such layout further assures that a portion of the back-gate region 12 is adjacent to the gate electrode 20 without fail, regardless of possible fluctuation in manufacturing performance.

The structure that satisfies the condition of $0<c\leqq 2b^2/a$ can achieve a channel width per unit area equal to or higher than that of the comparative example shown in FIGS. 10 and 11. Specifically, in FIG. 14, the channel width L indicated by bold lines is defined as $L=4(a-2b)+8(b-c)$. The cell area S is defined as $S=a^2-4b^2$. This leads to the conclusion that the channel width per unit area (L/S) can be equal to or larger than 4/a, which is the channel width per unit area of the comparative example, provided that $c\leqq 2b^2/a$ is satisfied, based on $L/S\geqq 4/a$. Such condition may be modified to $c\leqq a/8$ in the case of $b=a/4$, or to $c\leqq 2a/9$ in the case of $b=a/3$.

Figure 6:
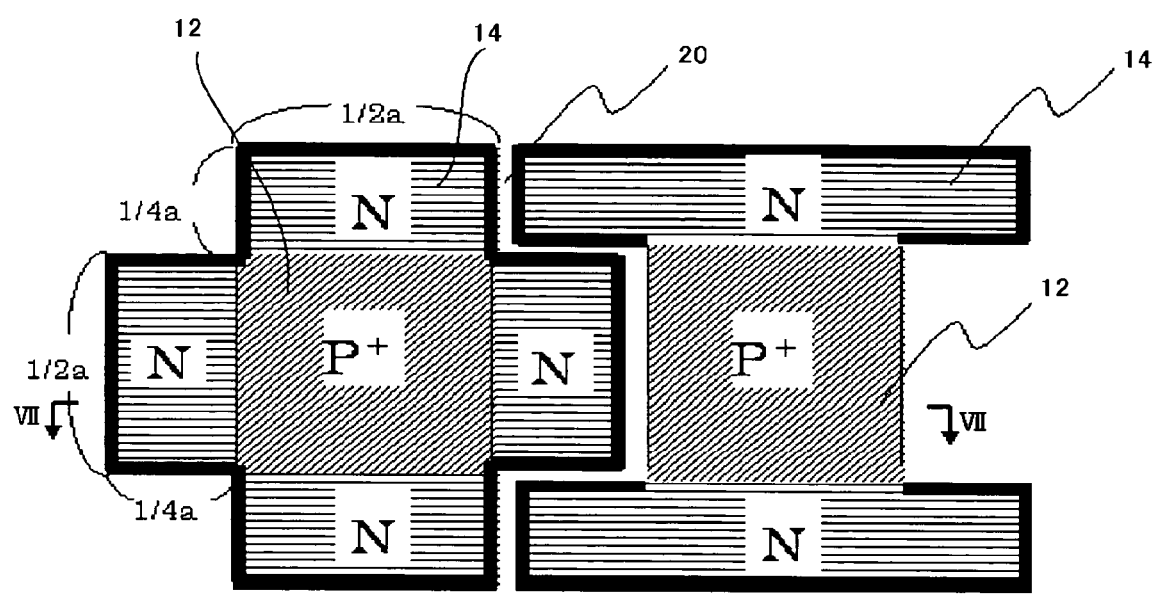
FIG. 6 is a schematic plan view showing a modified example of the semiconductor device according to the embodiment.
Figure 7:
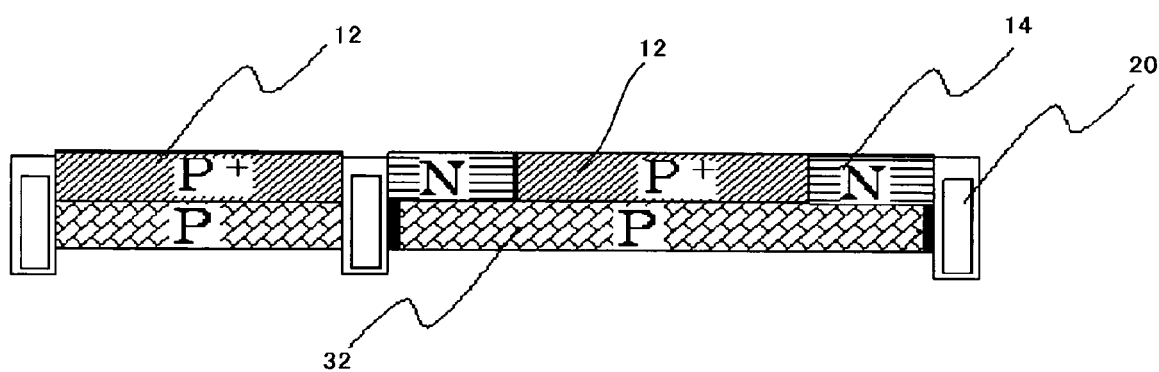
FIG. 7 is a cross-sectional view taken along the line VII-VII of FIG. 6.

The semiconductor device according to the present invention is not limited to the foregoing embodiments, but various modifications may be made. To cite a few examples, while the plurality of unit cells are of the same shape as one another in the embodiments, the shape of the unit cells may be different from one another. For instance, the unit cell as shown in FIG. 1 and the unit cell as shown in FIG. 4 may be provided in a semiconductor device, as shown in FIG. 6. The cross-sectional view taken along the line VII-VII of FIG. 6 is shown in FIG. 7. In this semiconductor device, the unit cell of FIG. 1 and the unit cell of FIG. 4 are located so as to be adjacent to each other, and the source region of one of the unit cells fits in the removed region of the other. In this case also, since the channel width and the cell area are 4 a and 0.75 $a^2$ respectively, the channel width per unit area is approx. 5.33/a.

Figure 15:
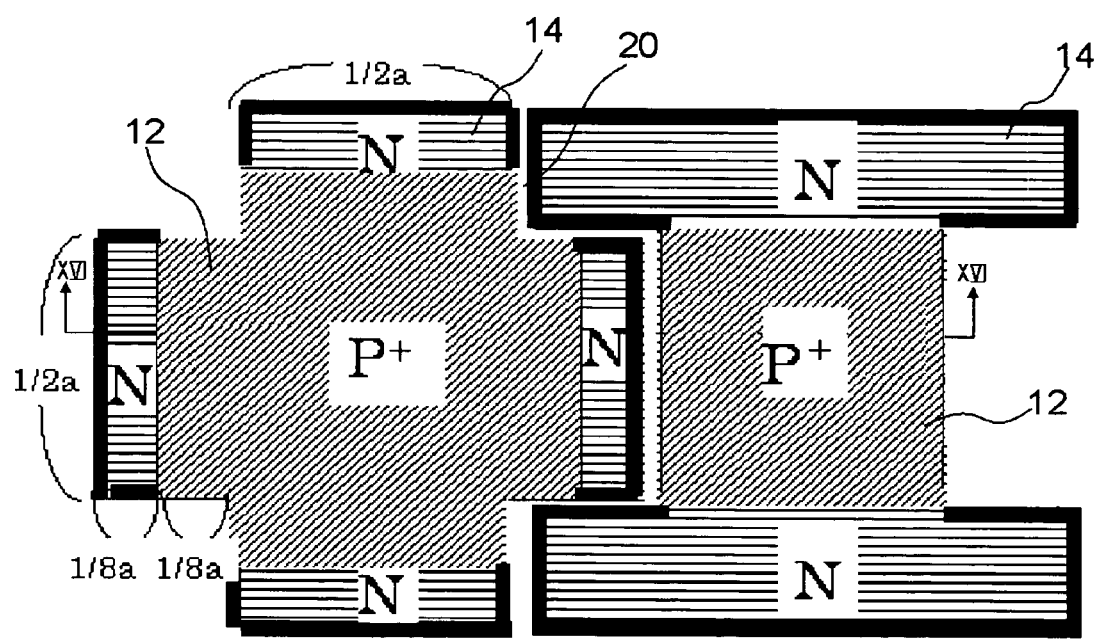
FIG. 15 is a schematic plan view showing another modified example of the semiconductor device according to the embodiment.
Figure 16:
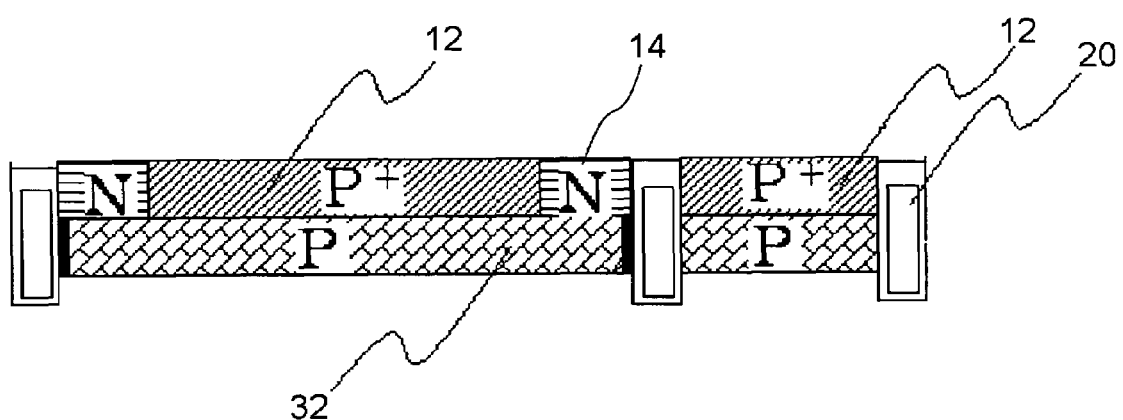
FIG. 16 is a cross-sectional view taken along the line XVI-XVI of FIG. 15.

Alternatively, the unit cell as shown in FIG. 1 and the unit cell as shown in FIG. 12 may be provided in a semiconductor device, as shown in FIG. 15. The cross-sectional view taken along the line XVI-XVI of FIG. 15 is shown in FIG. 16. In this semiconductor device, the unit cell of FIG. 1 and the unit cell of FIG. 12 are located so as to be adjacent to each other, and the source region of one of the unit cells fits in the removed region of the other. In this case, since the channel width and the cell area are 3 a and 0.75 $a^2$ respectively, the channel width per unit area is 4/a.

Figure 8:
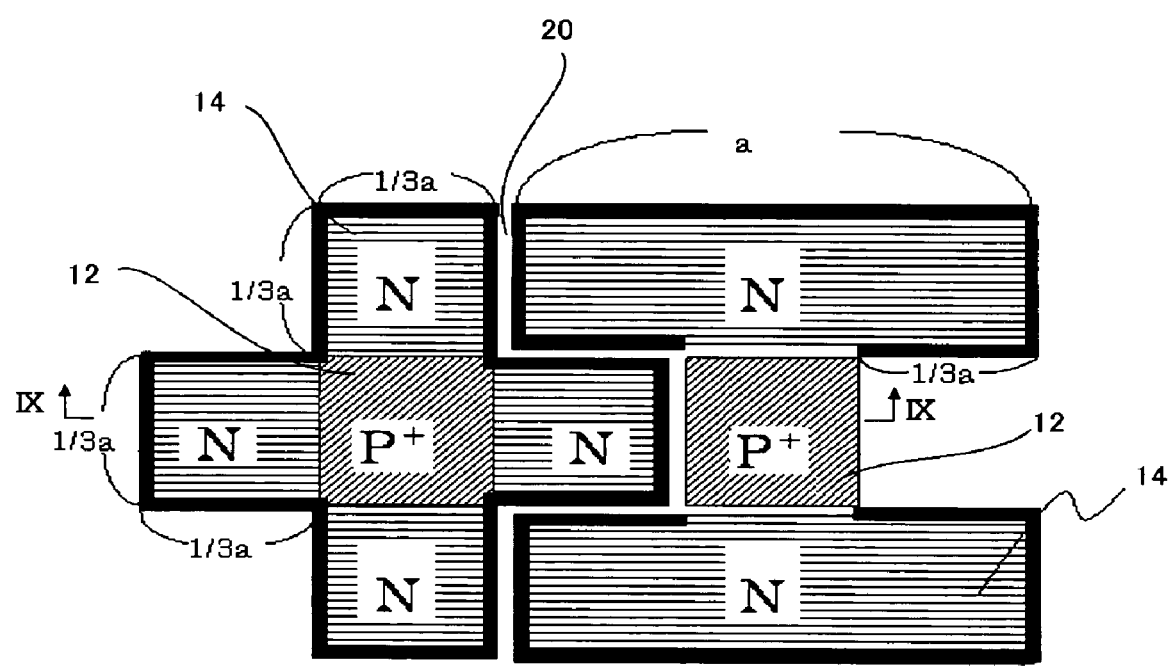
FIG. 8 is a schematic plan view showing another modified example of the semiconductor device according to the embodiment.
Figure 9:
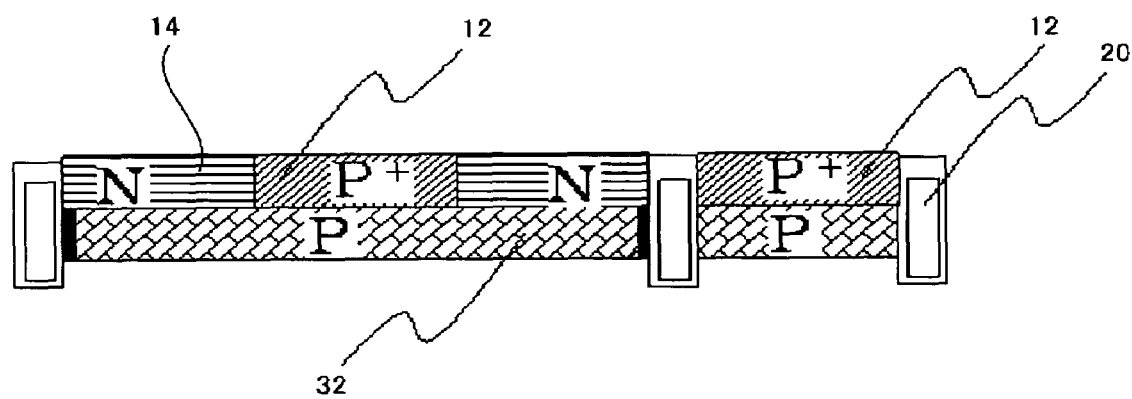
FIG. 9 is a cross-sectional view taken along the line IX-IX of FIG. 8.

Further, the dimensional configuration of the back-gate region 12 and the source region 14 are not limited to those adopted in the foregoing embodiments, but may be designed as shown in FIG. 8, for example. The cross-sectional view taken along the line IX-IX of FIG. 8 is shown in FIG. 9. In the unit cell at the left in FIG. 8, both of the back-gate region 12 and the source region 14 are in square shapes having the side length of a/3. In the unit cell at the right in FIG. 8, the back-gate region 12 is in a square shape having the side length of a/3, while the source region 14 is in a rectangular shape having the long side length of a and the short of a/3. Also in FIG. 8, the unit cells are disposed so as to be adjacent to each other, and the source region of one of the unit cells fits in the removed region of the other. In this case, since the channel width and the cell area are approx. 4.33 a and approx. 0.667 $a^2$ respectively, the channel width per unit area is further increased to approx. 6.49/a.

It is apparent that the present invention is not limited to the above embodiment, and may be modified and changed without departing from the scope and spirit of the invention.

What is claimed is:

1. A semiconductor device comprising:
   a unit cell including a back-gate region provided in a semiconductor substrate and a source region provided adjacently around said back-gate region in a plan view; and
   a gate electrode provided in a trench provided in said semiconductor substrate so as to surround said unit cell;
   wherein said unit cell coincides in a plan view with a residual region that remains upon deducting from a surrounding region defined as the imaginary rectangular region being the smallest among those capable of containing said unit cell, a removed region constituting a part of said surrounding region; and
   a portion of said back-gate region is adjacent to said gate electrode in said removed region,
   wherein a portion of a back-gate region of at least one adjacently positioned unit cell is disposed in the removed region.

2. The semiconductor device according to claim 1, wherein a total length of a portion of the perimeter of said source region adjacent to said gate electrode is not less than the perimetrical length of said surrounding region.

3. The semiconductor device according to claim 1, wherein said back-gate region is in a rectangular shape; said source region is provided so as to be adjacent to each of a pair of opposing sides of said back-gate region; and said source region is in a rectangular shape, a side of which includes one of said pair of opposing sides of said back-gate region and is longer than said one side of said back-gate region.

4. The semiconductor device according to claim 1, wherein said back-gate region is in a rectangular shape; said source region is provided so as to be adjacent to each of the four sides of said back-gate region; and said source region is in a rectangular shape, a side of which corresponds to one of said four sides of said back-gate regions, said source region include a first subregion and a second subregion that are positioned on opposite ends of said back-gate region, wherein said portion of said back-gate region of said at least one adjacently positioned unit cell is sandwiched between said first and second subregions of said source region of said unit cell.

5. The semiconductor device according to claim 1, wherein said removed region includes at least two rectangular regions located at each of the four corners of said surrounding region; and said back-gate region is adjacent to a portion of each of two sides of said removed region.

6. The semiconductor device according to claim 5, wherein each of said surrounding region and said removed region is in a square shape; and when a and b represent, respectively, the side length of said surrounding region and said removed region, the length of said portion of each of said two sides of said removed region, to which said back-gate region is adjacent, is not more than $2b^2/a$.

7. The semiconductor device according to claim 1, wherein a crystal orientation of a boundary surface between said source region and said gate electrode is (100).

8. The semiconductor device according to claim 1, further comprising an insulating interlayer provided on said gate electrode;
   wherein said insulating interlayer is located inside said trench.

9. The semiconductor device according to claim 1, comprising a plurality of said unit cells;
   wherein said source region of one of said unit cells is located in said removed region of another of said unit cells.

10. The semiconductor device according to claim 1, wherein said residual region is in a zygal shape.

11. The semiconductor device according to claim 1, wherein said residual region is in a cruciform shape.

12. A semiconductor device comprising:
   a first unit cell including a first back-gate region and a first source region provided adjacently around said first back-gate region in a plan view, said first unit cell having a zygal shape;
   a second unit cell including a second back-gate region and a second source region provided adjacently around said second back-gate region in a plan view, said second unit cell having a shape selected from the group consisting of a zygal shape and a cruciform shape; and
   a gate electrode provided in a trench so as to surround said first and second unit cells,
   wherein said first and second unit cells are provided adjacently to each other,
   said first unit cell is inscribed in a first imaginary rectangular region at four sides thereof, said first imaginary rectangular region includes said first unit cell as a first residual region and a first removed region,
   said second unit cell is inscribed in a second imaginary rectangular region at four sides thereof,
   said second imaginary rectangular region includes said second unit cell as a second residual region and a second removed region, and
   a part of said second unit cell is arranged in said first removed region of said first unit cell.

13. The semiconductor device according to claim 12, wherein, in each unit cell, a total length of a portion of the perimeter of said source region adjacent to said gate electrode is not less than the perimetrical length of each of said imaginary rectangular region.

14. The semiconductor device according to claim 12, wherein, in each said first and second unit cells, said back-gate region is in a rectangular shape,
   said source region includes two source region portions that are provided so as to be adjacent to each of a pair of opposing sides of said back-gate region, respectively, and
   each said two source region portions is in a rectangular shape,
   a side of which includes one of said pair of opposing sides of said back-gate region and is longer than said side of said back-gate region.

15. The semiconductor device according to claim 12,
   wherein, in each said first and second unit cells,
   said back-gate region is in a rectangular shape,
   said source region includes four source region portions that are provided so as to be adjacent to each of the four sides of said back-gate region, respectively, and
   each said four source region portions is in a rectangular shape,
   a side of which corresponds to one of said four sides of said back-gate region.

16. The semiconductor device according to claim 12,
   wherein said first back-gate region is in a rectangular shape,
   said first source region includes two source region portions that are provided so as to be adjacent to each of a pair of opposing sides of said first back-gate region, respectively, and
   each of said source region portions of said first source region is in a rectangular shape,
   a side of which includes one of said pair of opposing sides of said first back-gate region and is longer than said side of said first back-gate region, and
   wherein said second back-gate region is in a rectangular shape, said second source region includes four source region portions that are provided so as to be adjacent to each of the four sides of said second back-gate region, respectively, and
   each said source region portions of said second source region is in a rectangular shape,
   a side of which corresponds to one of said four sides of said second back-gate region.

17. The semiconductor device according to claim 12, wherein, in each said first and second unit cells, said back-gate region is in a cruciform shape.

18. The semiconductor device according to claim 16, wherein said second back-gate region is in a cruciform shape.

19. The semiconductor device according to claim 12, wherein a part of said second source region is located in said first removed region.

20. The semiconductor device according to claim 12, wherein said second unit cell is in a zygal shape, and said gate electrode provided between said first and second unit cells is in a zigzag shape in a plan view.

21. The semiconductor device according to claim 12, wherein said second unit cell is in a cruciform shape, and said gate electrode provided between said first and second unit cells is in a zigzag shape in a plan view.

* * * * *